United States Patent
Kim et al.

(12) 
(10) Patent No.: US 7,736,838 B2
(45) Date of Patent: Jun. 15, 2010

(54) METHODS FOR FORMING PATTERN USING ELECTRON BEAM AND CELL MASKS USED IN ELECTRON BEAM LITHOGRAPHY

(75) Inventors: Hee-Bom Kim, Suwon-si (KR); Seong-Woon Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 896 days.

(21) Appl. No.: 11/590,878

(22) Filed: Nov. 1, 2006

(65) Prior Publication Data

US 2007/0166646 A1 Jul. 19, 2007

(30) Foreign Application Priority Data

Jan. 17, 2006 (KR) .................. 10-2006-0005101

(51) Int. Cl.
*G03C 5/00* (2006.01)
(52) U.S. Cl. .................. 430/296; 430/312; 430/328; 430/394; 430/942
(58) Field of Classification Search .............. 430/296, 430/312, 328, 394, 942
See application file for complete search history.

(56) References Cited

FOREIGN PATENT DOCUMENTS

| JP | 06-267833 | 9/1994 |
|---|---|---|
| JP | 10-303120 | 11/1998 |
| KR | 10-2003-0056000 | 7/2003 |

*Primary Examiner*—Christopher G Young
(74) *Attorney, Agent, or Firm*—Harness, Dickey & Pierce, P.L.C.

(57) ABSTRACT

Provided methods for forming a pattern using electron beam and cell masks for electron beam lithography. The methods may include forming a resist layer on a substrate, the resist layer including a first region, a second region surrounding the first region, and a third region surrounding the second region. The second may be irradiated with electron beam at a first dose, and the third region may be irradiated with an electron beam at a second dose less than the first dose. The cell mask may include a mask substrate and a shielding region disposed on the mask substrate. A transmitting region may extend a distance from the shielding region. A gray pattern region may be disposed around the transmitting region. The gray pattern region may include patterns having a pitch smaller than a resolution limit.

16 Claims, 8 Drawing Sheets

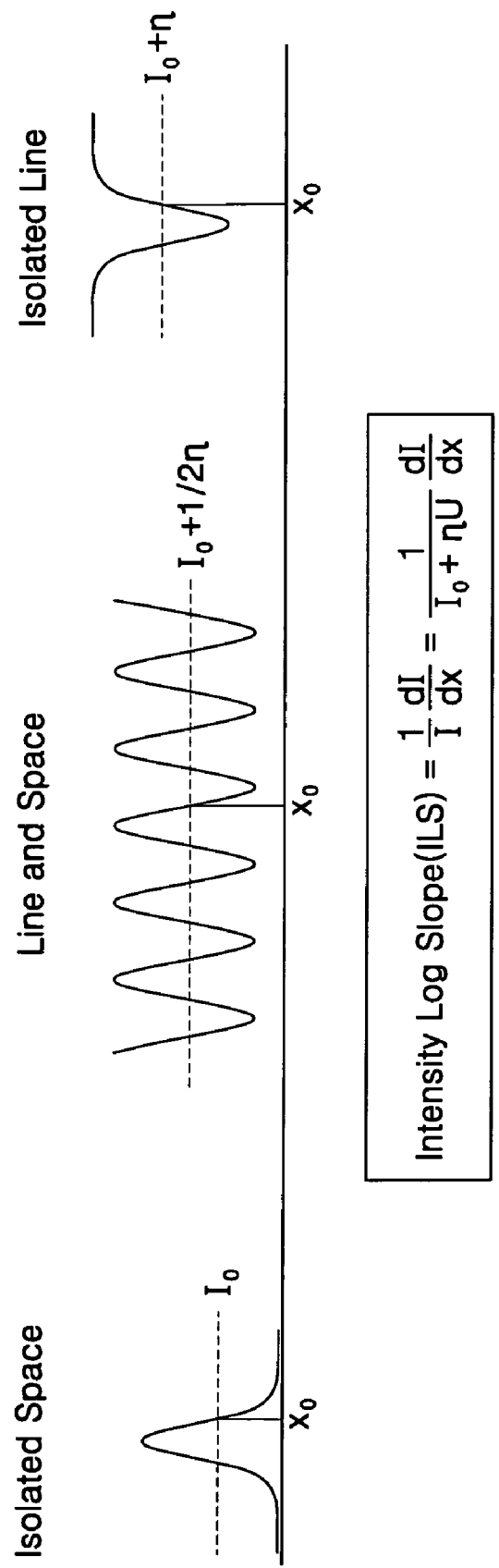

FIG. 4A
(CONVENTIONAL ART)
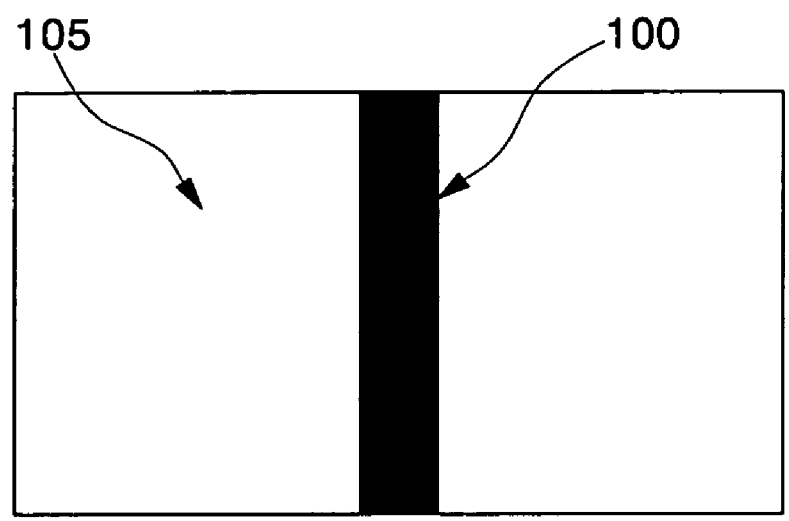
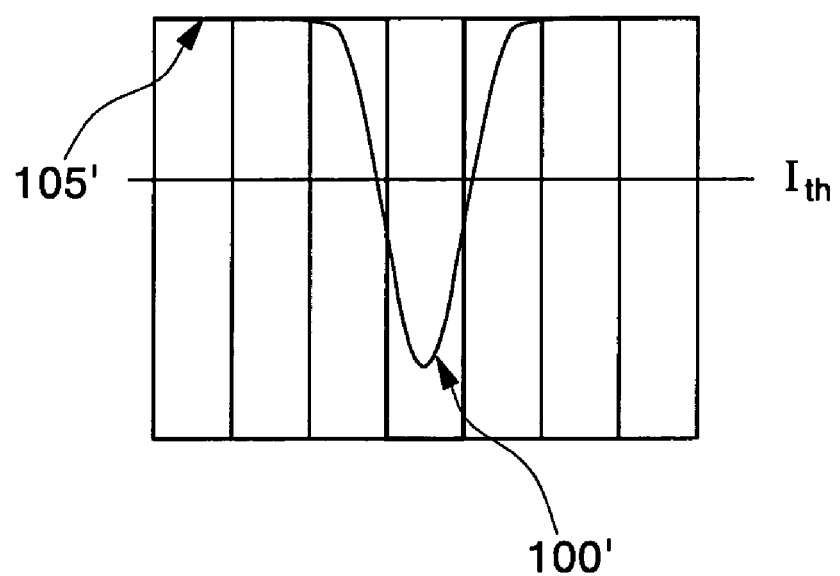

METHODS FOR FORMING PATTERN USING ELECTRON BEAM AND CELL MASKS USED IN ELECTRON BEAM LITHOGRAPHY

PRIORITY STATEMENT

This application claims the benefit of priority to Korean Patent Application No. 10-2006-0005101, filed on Jan. 17, 2006, the entire contents of which is hereby incorporated herein by reference.

BACKGROUND OF INVENTION

1. Technical Field

Example embodiments of the present invention relate to methods for forming a pattern and masks, and more particularly, to methods for forming a pattern using an electron beam and cell masks used in electron beam lithography.

2. Description of the Related Art

Electron beam lithography may be used to form a material layer on the surface of a substrate and to pattern the material layer. That is, electron beam lithography may include applying electron beam resist on the material layer, irradiating (or writing) the material layer with an electron beam along a pattern, developing the electron beam resist, and etching the material layer by using the electron beam resist pattern as a mask. Electron beam lithography may be used to directly form a material layer for an integrated circuit on the substrate, but typically is used when manufacturing a photo mask for photolithography.

A conventional method of manufacturing a photo mask is described in detail with reference to FIG. 1. The conventional method may include applying electron beam resist 130 on a shielding layer 120 formed on the entire surface of a transparent substrate 110, irradiating a pattern with an electron beam 150, developing the electron beam resist to form a resist pattern by using a solubility difference varying according to the electron beam irradiating, and etching the shielding layer 120 using the formed resist pattern as a mask.

However, the electron beam 150 exposes not only a desired region of the electron beam resist 130, but also an undesired region of the electron beam resist 130. An undesired region of the electron beam resist 130 may be exposed because the electron beam 150 reflects from the surface of the shielding layer 120, collides with atoms of the electron beam resist material and scatters inside the electron beam resist 130. This scattering 170 is referred to herein as forward scattering and backward scattering. Further, re-scattering 160 may occur because the electron beam reflects from the inside or surface of the electron beam resist 130 to the bottom surface of an objective lens 140 of an electron beam irradiator and from the bottom surface of the objective lens back to the electron beam resist 130.

Due to scattering 170 and re-scattering 160, the electron beam resist may be exposed up to a distance of 10 cm away from a portion targeted by the electron beam (i.e., a distance up to 10 cm away from an edge of the pattern). Forward scattering and backward scattering may be responsible for additional exposure up to about 10 μm, which may result in an undesired region of exposed electron beam resist 130. Also, the re-scattering may be responsible for additional exposure up to about 10 mm, which may result in an undesired region of exposed beam resist 130. The additional exposure may deteriorate the accuracy of the shield layer pattern, and may cause a change in critical dimension (CD). A change in the CD resulting from the additional exposure by the forward scattering and backward scattering is defined as a proximity effect, and the change in the CD resulting from the additional exposure by the re-scattering is defined as re-scattering effect, multiple scattering effect or fogging effect of the electron beam. When exposure is performed using the electron beam at a dose of about 8 μC/cm$^2$ and at an accelerating voltage of about 10 keV, the change in the CD of the photo mask because of the re-scattering effect of the electron beam may be about 10~20 nm, and this may significantly affect the manufacture of integrated circuits for high integration.

In a conventional method of reducing fogging effect, an absorption plate including grooves formed in a honeycomb pattern may be attached onto the lower surface of the objective lens 140 to absorb the re-scattered electron beam. However, because this conventional method cannot absorb all of the re-scattered electrons, this conventional method is limited in reducing the fogging effect.

FIG. 2 illustrates a conventional method for correcting the proximity effect of the backward scattering. FIG. 3 illustrates an intensity log slope at a patterning position in each pattern of FIG. 2.

FIGS. 2 and 3 will be referred to describe a method of artificially controlling a local dose of electrons to remove CD errors, which may result from dose variation between an isolated space pattern, a line and space pattern and an isolated line pattern. If the backward scattering range is sufficiently larger than the pattern size, a dose value may be determined by using the electron beam open ratio U of the pattern. The open ratio U of an isolated space pattern is about 0, and the open ratio U of the line and space pattern is ½ when the line to space ratio is 1:1. The open ratio U of the isolated line pattern is about 1. That is, the isolated line pattern is more exposed to the electron beam than the isolated space pattern and the line and space pattern.

FIG. 2 illustrates theoretical patterns and energy distributions before and after correcting the proximity effect with respect to the patterns. If the patterns are irradiated at the same dose as shown by the energy distribution before correcting the proximity effect, the isolated space pattern, the line and space pattern, and the isolated line pattern have different energy values. The energy values of the patterns are different because the total amount of backward scattering affecting each pattern varies with the open ratio U.

The total amount of the backward scattering equals the backward scattering coefficient η times the open ratio U. Thus, for the isolated space pattern where the open ratio U is about 0, the total amount of the backward scattering is about 0. For the line and space pattern where the open ratio U is about 1/2, the total amount of the backward scattering is about η/2. For the isolated line pattern where the open ratio U is about 1, the total amount of the backward scattering is about η. Consequently, in the isolated space pattern, the line and space pattern and the isolated line pattern are changed into about 1/2, about 1/2+1/2η and about 1/2+η, respectively, by the proximity effect. In order to equalize the dose values for patterning, the isolated space pattern and the line and space pattern may be irradiated at a corrected dose Dp for correcting the proximity effect. The corrected dose Dp may be represented as the following Equation (1):

$$Dp = (1/2+\eta)/(1/2+\eta U) \qquad (1)$$

As described above, irradiating the isolated space pattern and the line and space pattern at the corrected dose Dp may equalize the energy values for patterning. Equalizing the energy values may result in the CD values of the patterns being substantially uniform. However, this conventional method may substantially equalize the CD values but may also decrease a dose margin by the backward scattering.

FIG. 3 illustrates a formula of an intensity log slope (ILS) representing the dose margin by the backward scattering. In a typical electron beam lithography, the backward scattering coefficient η is about 0.5, wherein the ILS of the isolated line pattern having the open ratio U of about 1 decreases by about half relative to the isolated space pattern having the open ratio U of about 0. The ILS of the 1:1 line and space pattern having the open ratio of 1/2 is about 2/3 relative to the isolated space pattern.

That is, because a conventional method of correcting the proximity effect decreases the dose margin by the backward scattering as in the isolated line pattern, the conventional method is limited in equalizing the CD. Thus, it is important to decrease an absolute amount of the backward scattering. Consequently, in the electron beam lithography, it is important to decrease all of the forward scattering, backward scattering and re-scattering.

SUMMARY OF THE INVENTION

Example embodiments of the present invention provide methods for forming a pattern using electron beam capable of reducing forward scattering, backward scattering, and re-scattering in electron beam lithography.

Example embodiments of the present invention also provide cell masks used in electron beam lithography, which are suitable for reducing forward scattering, backward scattering, and re-scattering in electron beam lithography using the cell masks.

An example embodiment of the present invention provides a method for forming a pattern using an electron beam lithography apparatus. The method may include forming a resist layer on a substrate, the resist layer including a first region, a second region surrounding the first region, and a third region surrounding the second region. The second region may be irradiated with an electron beam at a first dose, and the third region may be irradiated with an electron beam at a second dose. The second dose may be less than the first dose.

In some example embodiments of the present invention, the resist layer may be a positive resist. A resist pattern remaining in the first region may be formed by removing the resist layers of the second and third regions irradiated with the electron beam.

In some example embodiments of the present invention, the resist layer may be a negative resist. Resist patterns remaining in the second and third regions may be formed by removing the resist layer of the first region not irradiated with the electron beam.

According to an example embodiment of the present invention, the second region may extend a distance from the first region.

According to an example embodiment of the present invention, the second region may have a width greater than a resolution limit of the electron beam lithography apparatus.

According to an example embodiment of the present invention, the second dose may be equal to or more than a minimum dose for patterning the resist.

According to an example embodiment of the present invention, an electron beam lithography apparatus may use a variable shaped beam (VSB) system or a raster scan system.

An example embodiment of the present invention provides a method for forming a pattern using an electron beam. The method may include forming a negative resist layer on a substrate, the negative resist layer including a first region, a second region shrinking to a distance from the first region, and a third region surrounding the first region. A region in the first region excluding the second region may be irradiated with an electron beam at a first dose. A second region may be irradiated with an electron beam at a second dose less than the first dose. A resist pattern remaining in the first region may be formed by removing the negative resist of the third region.

According to an example embodiment of the present invention, a shrink distance may be greater than a resolution limit of the electron beam lithography apparatus.

According to an example embodiment of the present invention, the second dose may be equal to or more than a minimum dose for patterning the negative resist.

According to an example embodiment of the present invention, the electron beam lithography apparatus may use a VSB system or a raster scan system.

An example embodiment of the present invention provides a cell mask used in electron beam lithography. The cell mask may include a mask substrate, and a shielding region disposed on the mask substrate. A transmitting region may extend a distance from the shielding region. A gray pattern region may be disposed around the transmitting region. The gray pattern region may include patterns having a pitch smaller than a resolution limit.

According to an example embodiment of the present invention, the extension distance may be greater than the resolution limit.

According to an example embodiment of the present invention, the gray pattern region may include line and space patterns or mesh patterns.

According to an example embodiment of the present invention, the gray pattern region may transmit electron beam energy greater than minimum energy for patterning resist.

An example embodiment of the present invention provides a method for forming a pattern using an electron beam lithography apparatus. The method may include forming a resist layer on a substrate, the resist layer including a first region and a second region; modifying a size of the second region to create at least one third region; irradiating the second region excluding the at least one third region with an electron beam having a first dose; and irradiating the at least one third region with the electron beam having a second dose. The first dose may be less than the second dose.

BRIEF DESCRIPTION OF THE DRAWINGS

The above and other features and advantages of the present invention will become more apparent by describing in detail example embodiments of the present invention with reference to the attached drawings in which:

FIG. 3 illustrates an intensity log slope (ILS) at a patterning position in each pattern of FIG. 2;

FIG. 4A illustrates a conventional electron beam lithography method;

DETAILED DESCRIPTION OF EXAMPLE EMBODIMENTS OF THE PRESENT INVENTION

Detailed illustrative embodiments of the present invention are disclosed herein. However, specific structural and functional details disclosed herein are merely representative for purposes of describing example embodiments of the present invention. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of example embodiments of the present invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments of the present invention will now be described more fully hereinafter with reference to the accompanying drawings. This invention may, however, be embodied in many different forms and should not be construed as being limited to the example embodiments set forth herein. Rather, these example embodiments are provided so that this disclosure will be thorough and complete, and will fully convey the scope of the invention to those skilled in the art. Like numbers refer to like elements throughout the drawings and specification.

Figure 4B:
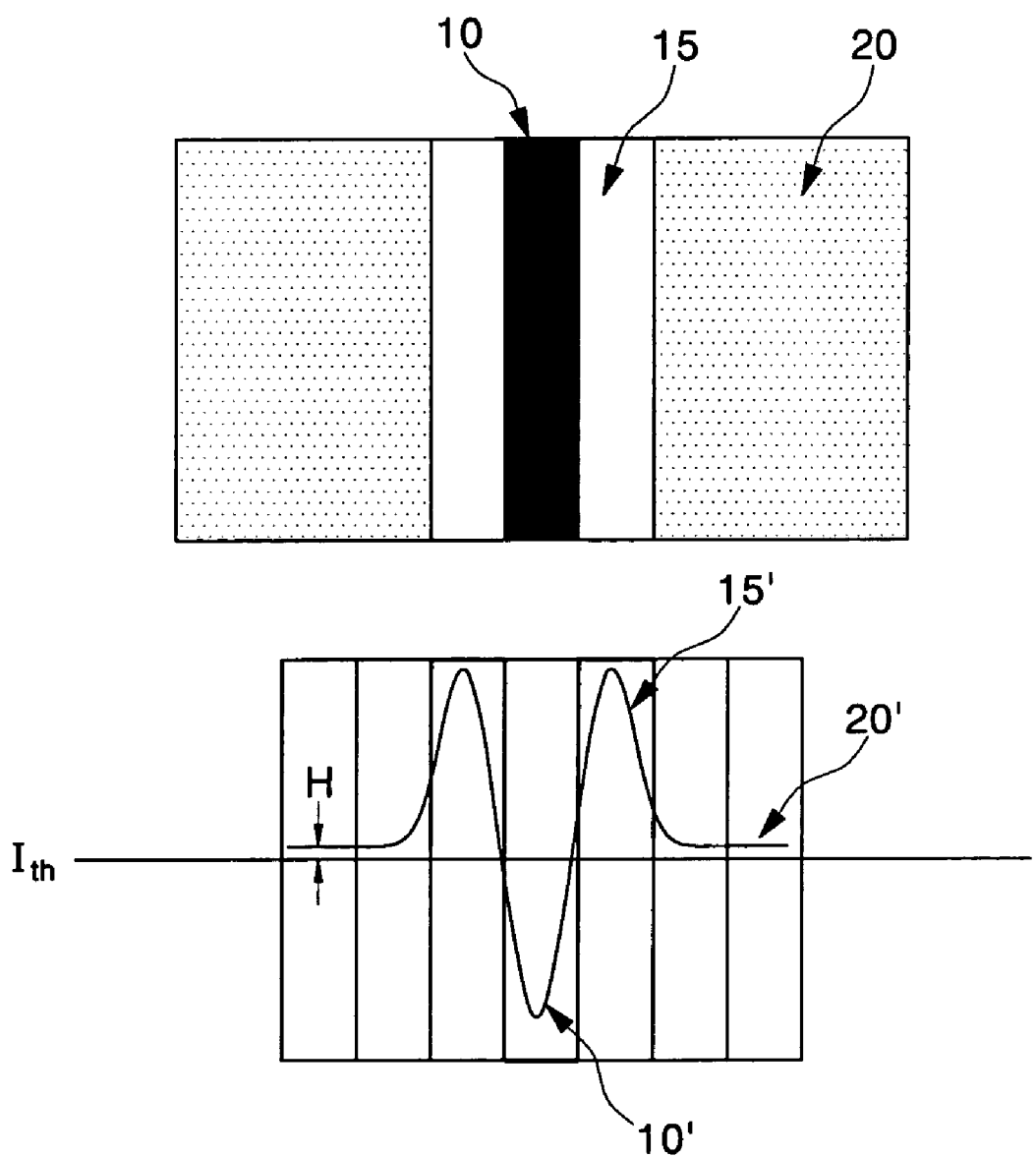
FIG. 4B illustrates an electron beam lithography method according to an example embodiment of the present invention.

FIG. 4A illustrates a conventional electron beam lithography method, and FIG. 4B illustrates an electron beam lithography method according to an example embodiment of the present invention.

Referring to FIGS. 4A and 4B, in a conventional electron beam lithography method, an entire peripheral region 105 excluding a line pattern 100 region may be irradiated at a uniform dose 105'. As a result, a dose 100' resulting from backward scattering of the dose 105' at which the peripheral region 105 is irradiated affects the line pattern 100 region as shown in FIG. 4A. On the other hand, in an electron beam lithography method according to an example embodiment of the present invention, a first dose region 15 adjacent to both sides of the line pattern 10 region may be irradiated at a first dose 15' while a second region 20 adjacent to the first dose region 15 and on a side of the first dose region 15 opposite the line pattern 10 may be irradiated at a second dose 20'. According to an example embodiment of the present invention, the second dose 20' is less than the first dose 15' and is equal to or more than a minimum dose $I_{th}$ for patterning, i.e., developing a resist. For example, the second dose 20' may add the minimum dose $I_{th}$ to a dose margin H. The dose margin H may be equal to a dose deviation arising from a process error.

Accordingly, an unnecessary dose and thus a total amount of backward scattering may be reduced according to an example embodiment of the present invention. The dose 10' in the line pattern 10 region of FIG. 4B showing an example embodiment of the present invention is less than the dose 100' in the line pattern 100 region of FIG. 4A showing a conventional example of backward scattering. As a result, the intensity log slope value shown in FIG. 3 may be improved according to an example embodiment of the present invention. In addition, the reduction in the total irradiated dose may result in a reduction of the forward scattering and re-scattering as well as the backward scattering. Thus, according to an example embodiment of the present invention, it may be possible to improve CD uniformity.

Figure 5:
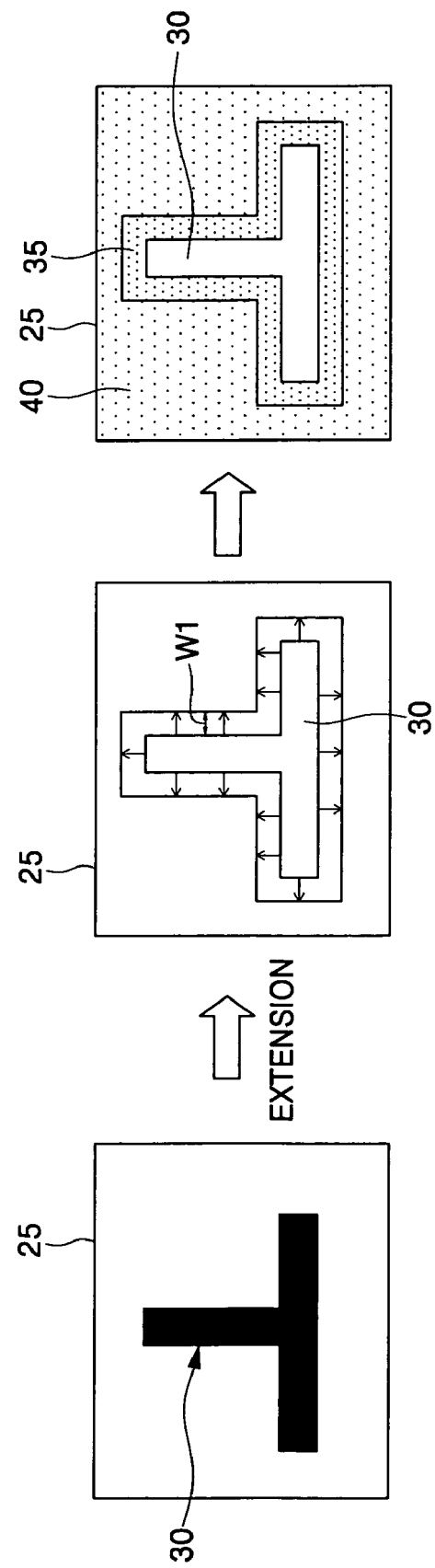
FIG. 5 shows plan views illustrating a method for forming a pattern using an electron beam lithography apparatus according to an example embodiment of the present invention.

FIG. 5 shows plan views illustrating a method for forming a pattern using an electron beam lithography apparatus according to an example embodiment of the present invention.

Referring to FIG. 5, a resist layer having a first region 25 may be formed on a substrate. The first region 25 may include a second region 30 and a third region 35 created by an extension of the second region 30. Accordingly, the third region 35 surrounds the second region 30. The third region 35 may have a width W1. The first region 25 may also include a fourth region 40 surrounding both the second region 30 and the third region 35. According to an example embodiment of the present invention, the third region 35 may be irradiated with an electron beam at a first dose, and the fourth region 40 may be irradiated with an electron beam at a second dose. The second dose may be less than the first dose according to an example embodiment of the present invention.

In some example embodiments of the present invention, the resist layer may be a positive resist. According to these example embodiments of the present invention, the substrate may be developed to remove the positive resist layers of the third region 35 and the fourth region 40, thereby forming a resist pattern remaining in the second region 30.

In other example embodiments of the present invention, the resist layer may be a negative resist. According to these example embodiments of the present invention, the substrate may be developed to remove the negative resist layer of the second region 30 not irradiated with the electron beam, thereby forming resist patterns remaining in the third and fourth regions 35 and 40.

According to an example embodiment of the present invention, the third region 35 may have a width WI greater than a resolution limit of the electron beam lithography apparatus. The second dose may be equal to or more than a minimum dose $I_{th}$ for patterning the resist. The electron beam lithography apparatus may use a variable shaped beam (VSB) system or a raster scan system.

As a result, a total dose in the first region 25 and thus, a total amount of the backward scattering may be reduced as compared to a conventional method of electron beam lithography. Accordingly, an intensity log slope (ILS) on a boundary between the second region 30 and the third region 35 may be improved as compared to a conventional method where both the third region 35 and the fourth region 40 would be irradiated with the electron beam at the first dose. As a result, a dose margin may be improved. Thus, critical dimension (CD) deviation of the resist pattern may be reduced.

According to an example embodiment of the present invention, a wide space region such as the fourth region 40, for example, may be irradiated only at a dose needed to develop the electron beam resist in the fourth region 40. The dose needed to develop may be somewhat greater than a dose that determines the boundary with the second region 30. However, because the wide space region such as the fourth region 40 is irradiated at a uniform dose according to a conventional method of electron beam lithography, a surplus dose is used in the conventional method, which may increase backward scattering, forward scattering, and re-scattering. Accordingly, example embodiments of the present invention reduce and/or minimize the surplus dose by irradiating the fourth region 40 at a reduced and/or minimum dose needed to develop the fourth region while maintaining the image slope through exposure at a normal dose on the boundary of the second region 30. In this case, an effective open ratio is about 1/2, improving the intensity log slope on the boundary of the first region 30. That is, it is possible to substantially minimize a reduced dose margin.

Figure 1:
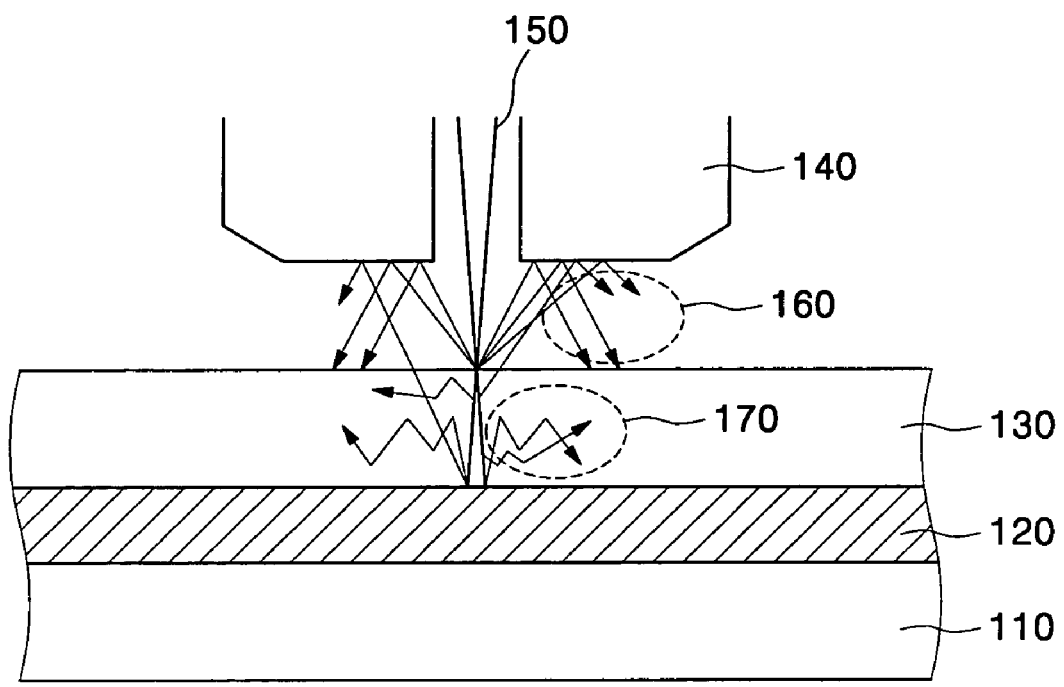
FIG. 1 is a cross-sectional view illustrating a conventional method for fabricating a photo mask using an electron beam lithography apparatus.
Figure 2:
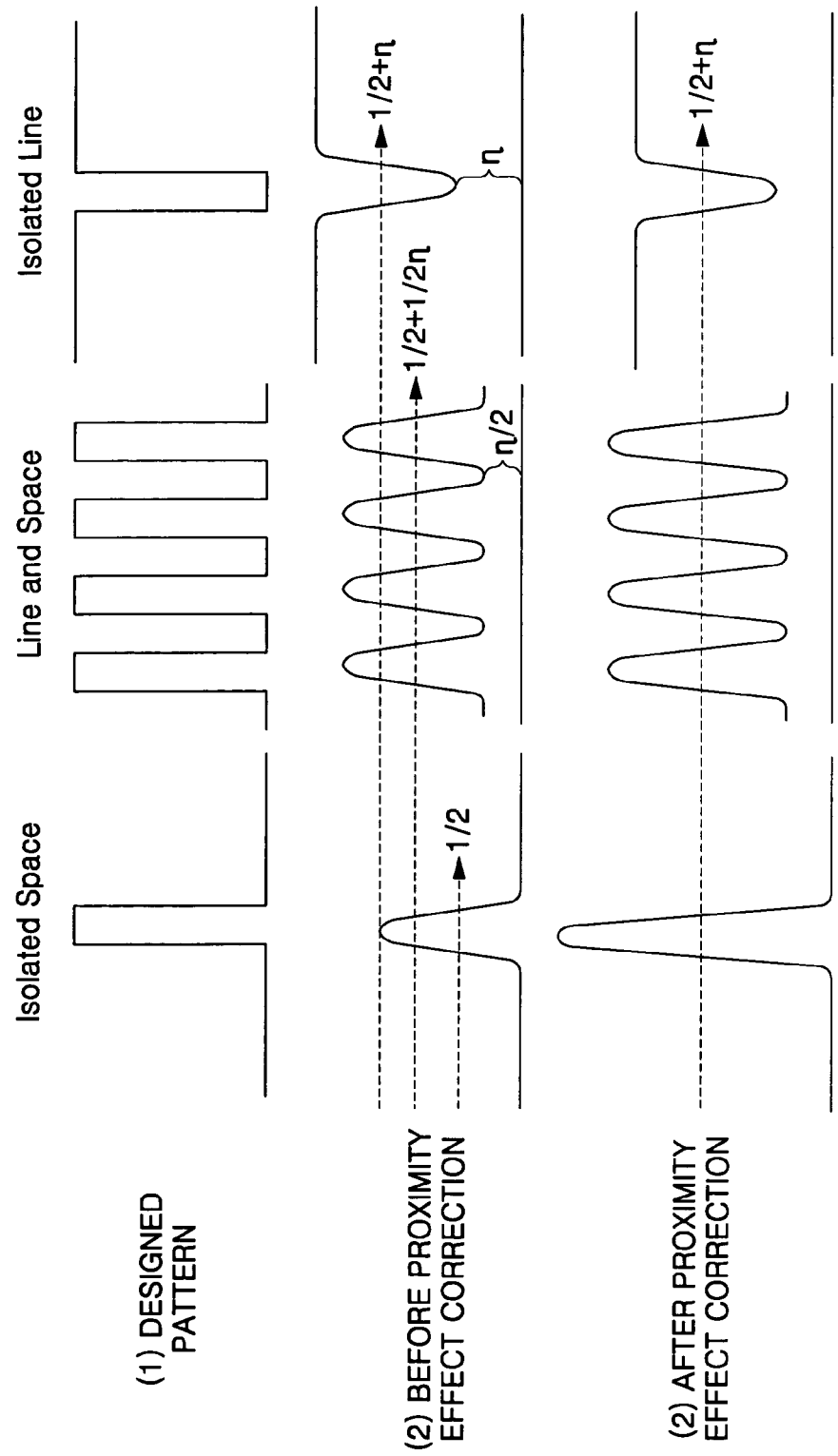
FIG. 2 illustrates a conventional method for correcting a proximity effect based on backward scattering.

Further, if all of the isolated space pattern, the line and space pattern, and the isolated line pattern are formed on the substrate as in FIG. 2, proximity effect correction should be performed by considering the effective open ratio of each pattern prior to electron beam irradiation, as in the conventional art. This makes it possible to maintain uniform CD while securing the dose margin of each pattern.

Figure 6:
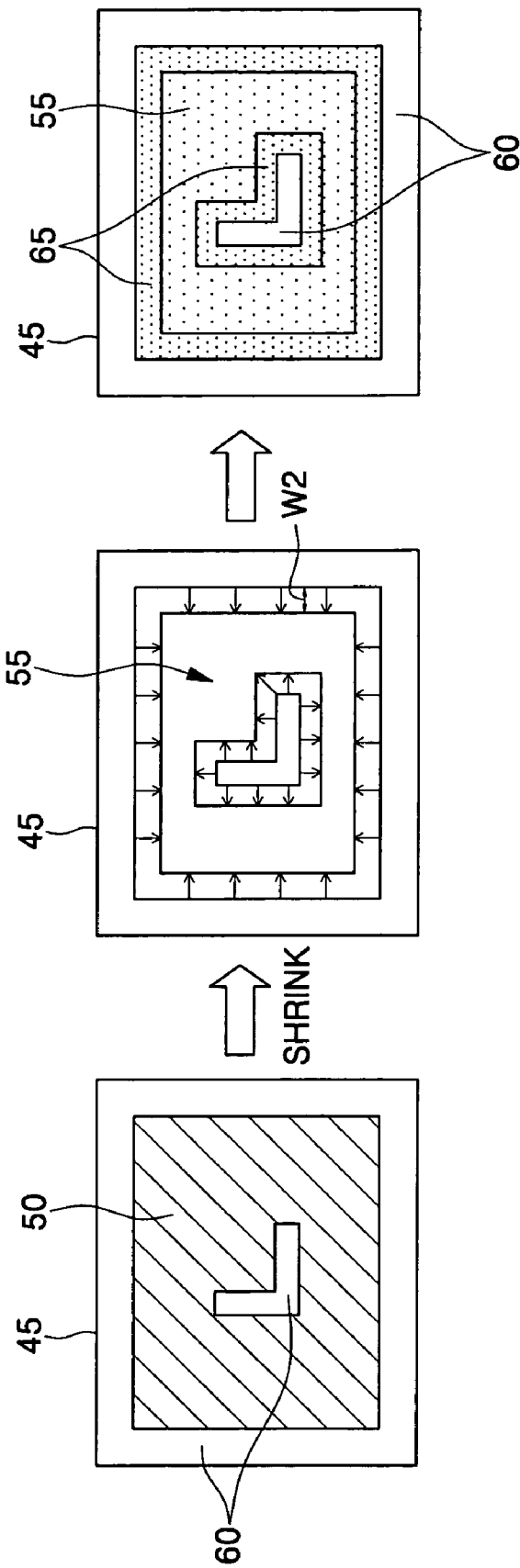
FIG. 6 shows plan views illustrating a method for forming a pattern using an electron beam lithography apparatus according to an example embodiment of the present invention.

FIG. 6 shows plan views illustrating a method for forming a pattern using an electron beam lithography apparatus according to an example embodiment of the present invention.

Referring to FIG. 6, a negative resist layer having a first region 45 may be formed on a substrate. The first region 45 may include a second region 50 and a third region 60. The third region 60 may include a first part surrounding the second region 50 and a second part within and surrounded by the second region 50. The second region 50 may shrink, thereby creating a fourth region 55. Further, the shrinking of the second region 50 also creates a fifth region 65 interposed between the third region 60 and the fourth region 55. The fifth region 65 may have a width W2. A fifth region 65 may be irradiated with an electron beam at a first dose, and the fourth region 55 may be irradiated with an electron beam at a second dose. The second dose may be less than the first dose according to an example embodiment of the present invention. The substrate may be developed to remove the negative resist of the third region 60, thereby forming a resist pattern remaining in the second region 50.

The width W2 between the third region 60 and the fourth region 55 may be greater than a resolution limit of the electron beam lithography apparatus. The second dose is equal to or more than a minimum dose $I_{th}$ for patterning the negative resist. The electron beam lithography apparatus may use a variable shaped beam (VSB) system or a raster scan system. The intensity log slope (ILS) on the boundary of the second region 50 may be improved as compared to a conventional method of electron beam lithography where all of the regions except the second region 50 are irradiated with the electron beam having the same dose, for example, the first dose.

Figure 7A:
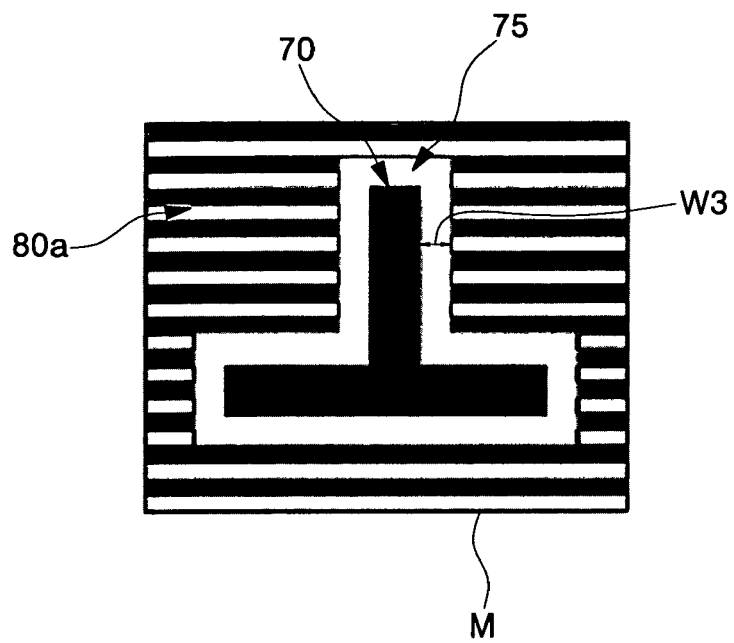
FIGS. 7A and 7B are plan views of cell masks according to example embodiments of the present invention.
Figure 7B:
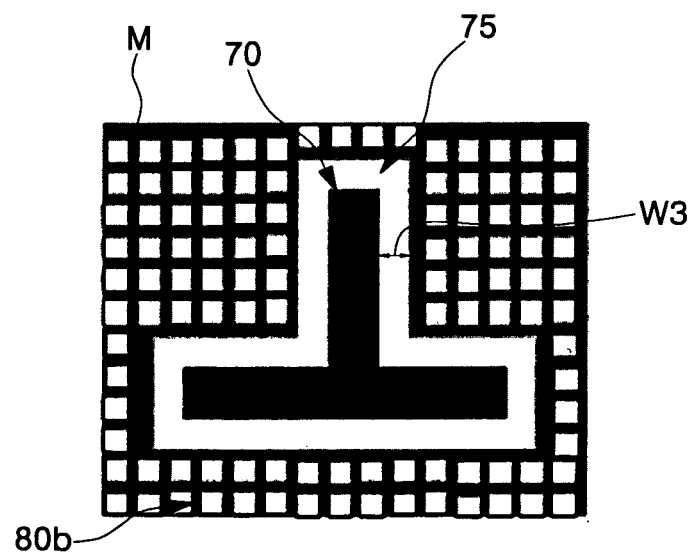

FIGS. 7A and 7B are plan views of cell masks according to example embodiments of the present invention.

Referring to FIGS. 7A and 7B, the cell mask may include a mask substrate M and a shielding region 70 disposed on the mask substrate M. A transmitting region 75 may be disposed on the mask substrate M around the shielding region 70. A gray pattern region 80a and 80b may be disposed around the transmitting region 75. The gray pattern region 80a and 80b may include patterns having a pitch smaller than a resolution limit of an electron beam. The transmitting region 75 may have a width W3, and the width W3 may be greater than the resolution limit upon electron beam irradiation.

The gray pattern region 80a and 80b may include line and space patterns 80a as shown in FIG. 7A and/or mesh patterns 80b as shown in FIG. 7B. The gray pattern region 80a and 80b may transmit electron beam energy greater than a minimum energy $I_{th}$ for patterning the resist.

In an electron beam lithography apparatus using the variable shaped beam (VSB) system or the raster scan system, energy may be adjusted by directly reducing a dose in a region through direct dose adjustment. However, in a projection type electron beam lithography apparatus using a mask in which dose adjustment may be difficult, a surplus dose in the resist region corresponding to the gray pattern region 80a and 80b may be reduced by the cell mask having the gray pattern region 80a and 80b. Accordingly, the masks of FIGS. 7A and 7B adjust the effective dose received in various regions of a substrate. As a result, the total dose and thus, the backward scattering, forward scattering, and re-scattering effect may be reduced according to an example embodiment of the present invention.

As described above, according to example embodiments of the present invention, when a relatively wide region relative to the resolution is formed using the electron beam, the region may be divided into the first region that may be a boundary region of the pattern, and a second region surrounding the first region. According to example embodiments of the present invention, only the first region that may be the boundary region may be irradiated with electron beam at a normal dose and the second region may be irradiated at a reduced and/or minimum dose that is needed for future development, thereby reducing and/or minimizing the scattering. That is, it is possible to reduce the total dose and thus the proximity effect and the re-scattering effect according to example embodiments of the present invention.

Example embodiments of the present invention have been disclosed herein and, although specific terms are employed, they are used and are to be interpreted in a generic and descriptive sense only and not for purpose of limiting the present invention. Accordingly, it will be understood by those of ordinary skill in the art that various changes in form and details may be made without departing from the spirit and scope of the present invention.

What is claimed is:

1. A method for forming a pattern using an electron beam lithography apparatus, the method comprising:
   forming a resist layer on a substrate, the resist layer including a first region, a second region surrounding the first region, and a third region surrounding the second region; and
   irradiating the second region with an electron beam at a first dose; and
   irradiating the third region with an electron beam at a second dose, wherein the second dose is less than the first dose.

2. The method of claim 1, wherein the resist layer is a positive resist.

3. The method of claim 2, further comprising:
   forming a resist pattern remaining in the first region by removing the resist layer of the second and third regions irradiated with the electron beam.

4. The method of claim 1, wherein the resist layer is a negative resist.

5. The method of claim 4, further comprising:
   forming resist patterns remaining in the second and third regions by removing the resist layer of the first region not irradiated with the electron beam.

6. The method of claim 1, wherein the second region extends a distance from the first region.

7. The method of claim 1, wherein the second region has a width greater than a resolution limit of the electron beam lithography apparatus.

8. The method of claim 1, wherein the second dose is equal to or more than a minimum dose for patterning the resist layer.

9. The method of claim 1, wherein the electron beam lithography apparatus uses a VSB (variable shaped beam) system or a raster scan system.

10. A method for forming a pattern using an electron beam lithography apparatus, the method comprising:
    forming a negative resist layer on a substrate, the negative resist layer including a first region, a second region shrinking to a distance from the first region, and a third region surrounding the first region;
    irradiating a region in the first region excluding the second region with an electron beam at a first dose;
    irradiating the second region with electron beam at a second dose less than the first dose; and
    forming a resist pattern remaining in the first region by removing the negative resist of the third region.

11. The method of claim 10, wherein the shrink distance is greater than a resolution limit of the electron beam lithography apparatus.

12. The method of claim 10, wherein the second dose is equal to or more than a minimum dose for patterning the negative resist.

13. The method of claim 10, wherein the electron beam lithography apparatus uses a VSB system or a raster scan system.

14. A method for forming a pattern using an electron beam lithography apparatus, the method comprising:
    forming a resist layer on a substrate, the resist layer including a first region and a second region;
    modifying a size of the second region to create at least one third region;
    irradiating the second region excluding the at least one third region with an electron beam having a first dose; and
    irradiating the at least one third region with the electron beam having a second dose, wherein
    the first dose is less than the second dose.

15. The method of claim 14, wherein modifying comprises:
    extending the second region to create the at least one third region.

16. The method of claim 14, wherein the modifying comprises:
    shrinking the second region to create the at least one third region.

* * * * *